(12) United States Patent
Jones et al.

(10) Patent No.: US 8,145,877 B2
(45) Date of Patent: Mar. 27, 2012

(54) ADDRESS GENERATION FOR QUADRATIC PERMUTATION POLYNOMIAL INTERLEAVING

(75) Inventors: Ben J. Jones, Edinburgh (GB); Colin Stirling, Edinburgh (GB)

(73) Assignee: Xilinx, Inc., San Jose, CA (US)

( * ) Notice: Subject to any disclaimer, the term of this patent is extended or adjusted under 35 U.S.C. 154(b) by 964 days.

(21) Appl. No.: 12/059,731

(22) Filed: Mar. 31, 2008

(65) Prior Publication Data

US 2009/0249024 A1    Oct. 1, 2009

(51) Int. Cl.
*G06F 9/26* (2006.01)

(52) U.S. Cl. .............. 711/217; 711/5; 711/157

(58) Field of Classification Search .............. 711/217
See application file for complete search history.

(56) References Cited

U.S. PATENT DOCUMENTS

| | | |
|---|---|---|
| 5,905,665 A | 5/1999 | Rim |
| 2004/0064666 A1* | 4/2004 | Bickerstaff .............. 711/200 |

FOREIGN PATENT DOCUMENTS

EP    0 047 842 A2    3/1982

OTHER PUBLICATIONS

Jonghoon Ryu; Takeshita, O.Y.; , "On quadratic inverses for quadratic permutation polynomials over integer rings," Information Theory, IEEE Transactions on , vol. 52, No. 3, pp. 1254-1260, Mar. 2006.*
Ericsson, *Quadratic Permutation Polynomial Interleavers for LTE Turbo Coding*, Nov. 6, 2006, pp. 1-5, 3GPP TSG-RAN WG1 #47, R1-063137, $3^{rd}$ Generation Partnership Project (3GPP), Sophia-Antipolis Cedex, France.
Sun, Yang et al., "Configurable and Scalable High Throughput Turbo Decoder Architecture for Multiple 4G Wireless Standards," *Proc. of the 2008 International Conference on Application-Specific Systems*, Jul. 2, 2008, pp. 209-214, IEEE, Piscataway, New Jersey, USA.
3GPP, "Quadratic Permutation Polynomial Interleaver Designs for LTE Turbo," Jan. 9, 2007, 3GPP TSG-RAN WG1 #47bis, R1-070462.

* cited by examiner

*Primary Examiner* — Sheng-Jen Tsai
*Assistant Examiner* — Ramon A Mercado
(74) *Attorney, Agent, or Firm* — W. Eric Webostad; John King (57) ABSTRACT

For address generation, a block size and a skip value are obtained, and at least one address, at least one increment value, and a step value are initialized. For a count index not in excess of a block size, iteratively performed are: selection of an output address for output from at least one phase responsive to at least the at least one address; first update of the at least one address as being equal to summation of the at least one increment and the at least one address modulo the block size; and second update of the at least one increment as being equal to summation of the at least one increment and the step value modulo the block size. The selection and the first and second updates are iteratively repeated responsive to increments of the count index to output a sequence of addresses.

19 Claims, 7 Drawing Sheets

ADDRESS GENERATION FOR QUADRATIC PERMUTATION POLYNOMIAL INTERLEAVING

FIELD OF THE INVENTION

The invention relates to integrated circuit devices (ICs). More particularly, the invention relates to address generation for Quadratic Permutation Polynomial interleaving for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Some FPGAs, such as the Virtex FGPA, can be programmed to incorporate blocks with pre-designed functionalities, i.e., "cores". A core can include a predetermined set of configuration bits that program the FPGA to perform one or more functions. Alternatively, a core can include source code or schematics that describe the logic and connectivity of a design. Typical cores can provide, but are not limited to, digital signal processing (DSP) functions, memories, storage elements, and math functions. Some cores include an optimally floorplanned layout targeted to a specific family of FPGAs. Cores can also be parameterizable, i.e., allowing the user to enter parameters to activate or change certain core functionality.

Turbo channel codes (Turbo codes) conventionally are processed using an interleaver circuit to shuffle input data before encoding by a constituent convolutional encoder. Of note, by Turbo Code coding it is meant convolutional coding in contrast to Product Code coding or Product Codes. To form an interleaved data sequence during such encoding, data is conventionally read from an input buffer in a permutated order according to an interleaved address sequence.

There is a movement to replace prime-permutation interleavers used in $3^{rd}$ Generation Partnership Project (3GPP) communication systems with Quadratic Permutation Polynomial (QPP) interleavers. QPP interleavers generally are "maximally contention-free" as any factor of the interleaver length may be used as a parallel processing order. Thus, maximally contention-free addressing may facilitate parallel processing during Turbo Code decoding.

QPP interleavers may be used for 3GGP Long Term Evolution (LTE) Turbo Code coding. A QPP interleaver output may be read responsive to an address of interleaved address sequence given by:

$$\Pi(x) = (f_1 x + f_2 x^2) \bmod K \qquad (1)$$

where $0 \leq x, f_1, f_2 < K$. The x-th interleaved output is read from the address given by Equation 1, where K is an information block length and where $f_1$, and $f_2$ are respective coefficients. QPP interleavers may be used for Turbo Codes with either tail-biting or terminated trellising.

Specification of a QPP interleaver may thus be formulated as a quadratic equation using modulo-K arithmetic. This formulation as a quadratic equation facilitates random access to an address sequence directed by computation of the quadratic formula. However, this computation involves multiplication and modulo operations which may be cumbersome. In particular, multiplication and modulo operations may result in relatively large, high-latency circuits when implemented in an FPGA.

SUMMARY OF THE INVENTION

One or more aspects of embodiments of the present invention generally relate to address generation and, more particularly, to address generation for Quadratic Permutation Polynomial interleaving for an integrated circuit (IC).

An aspect relates generally to a method for address generation, including: obtaining a block size and a skip value; initializing at least one address, at least one increment value, and a step value; and setting a count index for incrementally counting from an initial value to a terminal value, where the terminal value is bounded by the block size. For the count index not in excess of the terminal value, iteratively performed are: selection of an output address for output from at least one phase responsive to at least the at least one address;

first update of the at least one address as being equal to summation of the at least one increment and the at least one address modulo the block size; second update of the at least one increment as being equal to summation of the at least one increment and the step value modulo the block size; increment of the count index; and repetition of the selecting for the at least one address updated, the first updating for the at least one address updated and the at least one increment updated, and the second updating for the at least one increment updated to output a sequence of addresses. The sequence of addresses is output responsive to iterative generation of the output address.

Another aspect relates generally to a method for address generation, including: obtaining a block size and a skip value; initializing addresses, increment values, and a step value, where the initializing of the addresses and the increment values are performed as a first loop having a first count index bounded by the skip value obtained; and setting a second count index for incrementally counting from a first initial value to a first terminal value for a second loop, where the first terminal value is bounded by the block size. For the second count index not in excess of the first terminal value, iteratively performed are: first selection of an output address for output from a phase of a plurality of phases; second increment of the second count index; third update of the selected address as equal to summation of the selected address and its associated increment modulo the block size; and fourth update of the increment associated with the selected address as equal to summation of said increment and the step value modulo the block size. A sequence of addresses is output responsive to iterative generation of the output address.

Yet another aspect relates generally to an apparatus for address generation, including: first storage having a step value; second storage having a block size; a first subtractor coupled to the first storage and the second storage to respectively receive the step value and the block size as inputs for subtracting the block size from the step value to output a first difference; an increment stage coupled to receive the step value and the first difference; the increment stage configured to update a first increment as being equal to summation of the first increment and the step value modulo the block size to output an updated increment; the increment stage further configured to update a second increment as being equal to summation of the second increment and the step value modulo the block size to output the updated increment; a second subtractor coupled to the second storage and the increment stage to respectively receive the block size and the updated increment as inputs for subtracting the block size from the updated increment to output a second difference; an address stage coupled to receive the updated increment and the second difference; the address stage configured to update a first address as being equal to summation of the first increment and the first address modulo the block size to output an interleaver address; the address stage further configured to update a second address as being equal to summation of the second increment and the second address modulo the block size to output the interleaver address; control circuitry configured for initializing the first address, the second address, the first increment, the second increment, and the step value; the control circuitry further configured to provide a count index associated with counting iterations from 1 to the block size as associated with a sequence; the control circuitry further configured to select the interleaver address for output from a value stream of a plurality of value streams; the interleaver address set responsive to modulo a skip value of the count index to the first address or the second address for there being at least two value streams of the plurality of value streams; and the at least two value streams including a first value stream and a second value stream for respectively selecting the first address or the second address therefrom.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Embodiments of the present invention are applicable to many types of integrated circuits, including those having programmable logic. However, examples of some embodiments are described in relation to application in Programmable Logic Devices (PLDs) such as Complex Programmable Logic Devices (CPLDs) and Field Programmable Gate Arrays (FPGAs). These exemplary descriptions are not intended to limit embodiments of the present invention, but to illuminate and fully describe them.

Figure 1:
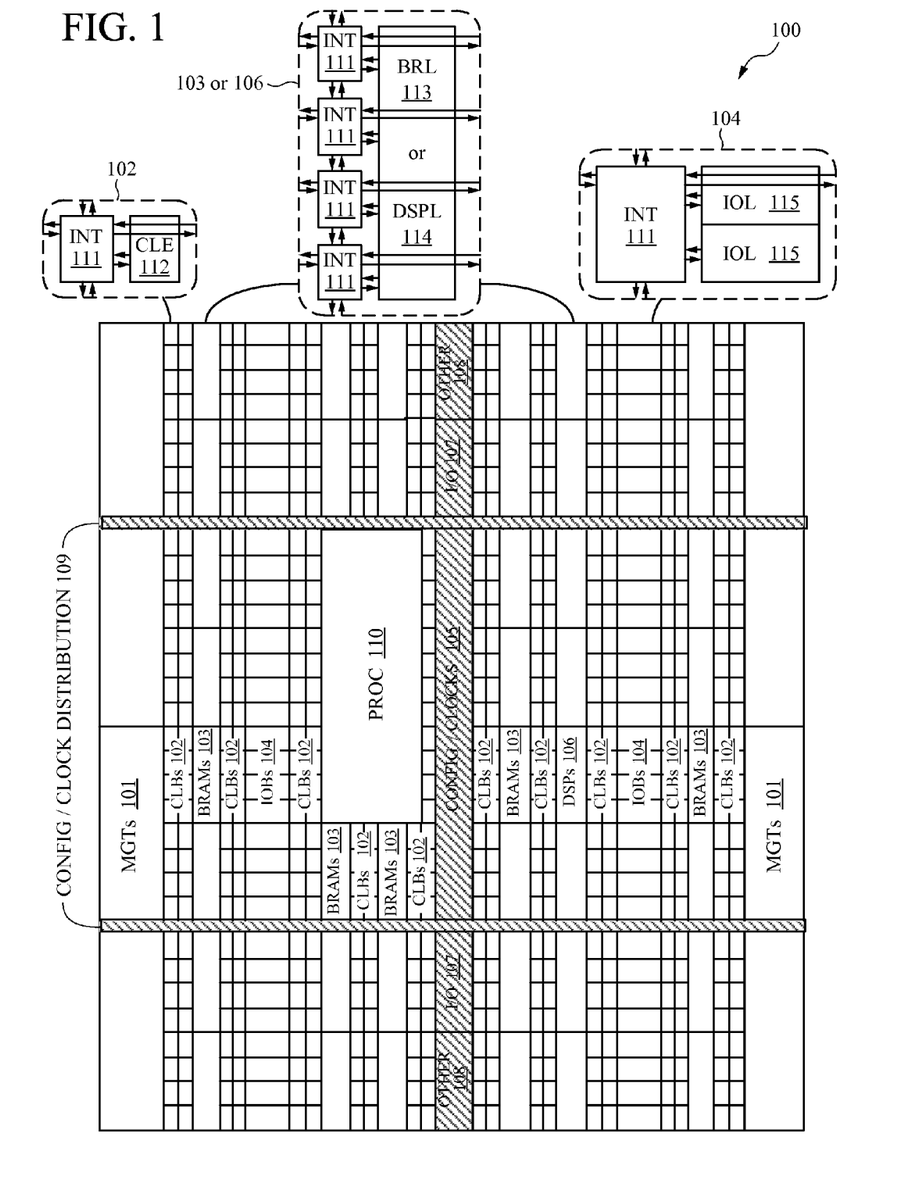
FIG. 1 is a simplified block diagram depicting an exemplary embodiment of a columnar Field Programmable Gate Array ("FPGA") architecture in which one or more aspects of the invention may be implemented.

For example, FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output ports (1/0) 107 (e.g., configuration ports and clock ports), and other programmable logic 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element (CLE) 112 that can be programmed to implement user logic plus a single programmable interconnect element 111. A BRAM 103 can include a BRAM logic element (BRL 113) in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

In the following description, computation of address sequences for a QPP interleaver is described. Address sequence computing (ASC) circuitry takes as its input a relatively small set of initialization vectors and parameter values. These parameter values include block size, K. Output of ASC circuitry is an address sequence consisting of the values for $0 \ldots (K-1)$ in a permutated order for a QPP formula, namely a quadratic equation, used by a QPP interleaver.

A "first derivation" of Equation 1 may be expressed as:

$$\Pi'(x) = [f_2(2nx+n^2) + f_1 n] \bmod K \qquad (2)$$

where n is a "skip" value for a sequence. That is, for n equal to 1, the sequence 0, 1, 2, 3, 4, etc. is generated. For n equal to 2, every second term in the n equal to 1 sequence is omitted, namely the sequence 0, 2, 4, 6, 8, etc. is generated. Of note, a starting integer of 1 may be used instead of zero. However, it should be appreciated that any integer value of n, for n greater than zero, may be used. A "second derivation" of Equation 1 from Equation 2 may be expressed as:

$$\Pi''(x) = [2n^2 f_2] \bmod K \qquad (3)$$

Thus, a quadratic formula for a QPP interleaver may be implemented using strength reduction, namely using the first and second derivations. The difference between successive terms of the first derivation is a linear function. Moreover, the difference between successive terms of the second derivation is a constant.

Initial values of Equation 1, as well as the derivative variables of Equations 2 and 3, are dependent upon coefficients of Equation 1. For purposes of clarity by way of example and not limitation, a skip value of two is used to describe operations. However, from the following description it should be understood that generally any positive integer skip value greater than zero of interest may be used. For example, for a skip value of n equal to 2, the initialization values for Equations 1, 2, and 3 may be determined as follows:

$$A^0 = A_{even}^0 = \Pi(0) = 0 \qquad (1a)$$

$$A^1 = A_{odd}^0 = \Pi(1) = (f_1 + f_2) \bmod K \qquad (1b)$$

$$I_{even}^0 = \Pi'(0) = [4f_2 + 2f_1] \bmod K \qquad (2a)$$

$$I_{odd}^0 = \Pi'(1) = [8f_2 + 2f_1] \bmod K \qquad (2b)$$

$$S = \Pi''(x) = [8f_2] \bmod K \qquad (3a)$$

where A, I, and S respectively are address, increment, and step. It should be understood that step S is a constant which is set responsive to skip value n, which in Equation 3a, skip value n is equal to 2. However, in Equations 1a, 1b, 2a, and 2b, a coefficient value of skip value n is used to indicate a relative starting location in a sequence. Thus, for example, an even numbered sequence may be 0, 2, 4, . . . for a skip value of n equal to 2, and an odd numbered sequence may be 1, 3, 5, . . . for a skip value of n equal to 2. Of note, addresses A generated for a QPP interleaver are independent of the Turbo Code used for encoding.

Additionally, the interleaved sequence of addresses produced may be used for de-interleaving. For example, a received sequence of data bits may be written to memory as such sequence arrives, using an interleaved address sequence as the write address. The original sequence may then be recovered by reading out the contents of the memory in linear order.

Figure 2:
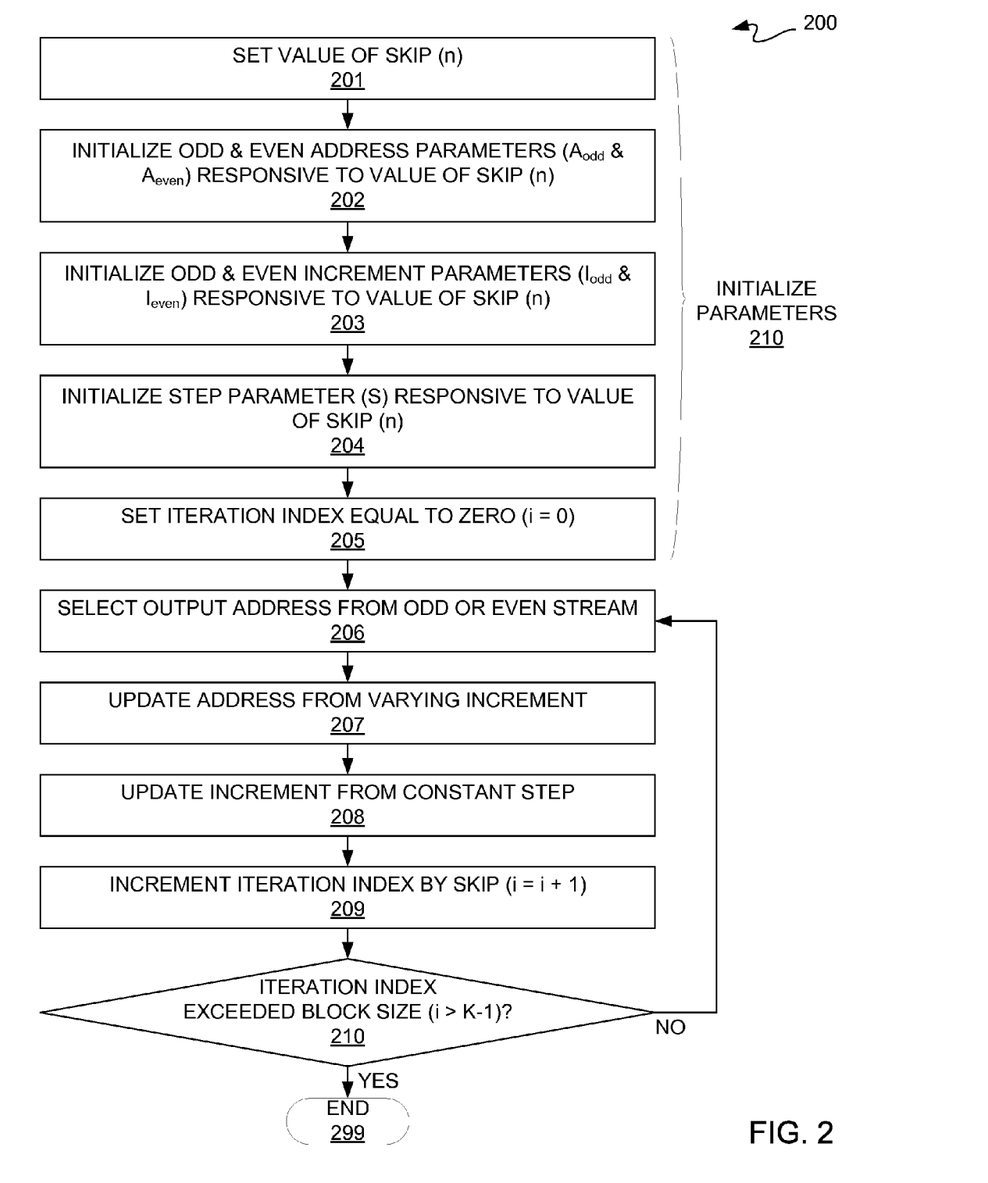
FIG. 2 is a flow diagram depicting an address generation flow in accordance with an embodiment of the present invention.

FIG. 2 is a flow diagram depicting an exemplary embodiment of an address generation flow 200. At 201, a skip value n is set. Skip value n is associated with the number of sequences to be employed. For purposes of clarity by way of example and not limitation, it shall be assumed that the skip value n is set equal to two. However, once again, from the following description it should be understood that generally any positive integer step value greater than zero of interest may be used. For a skip value of 2, there may be an odd valued sequence and an even valued sequence from which to select addresses. However, from the following description it will be understood that other skip values may be used.

An address sequence consists of values from zero to K−1 in a permutated order according to a quadratic formula for QPP interleaving. As shall be appreciated from the following description, even though two subsequence generators are described for an embodiment, namely one subsequence generator for generating an odd sequence and another subsequence generator for generating an even sequence, an address for interleaving may be computed on each clock cycle, and only a single physical subsequence generator may be used. For an FPGA implementation, clock speed may approach the maximum achievable speed of a target device responsive to pipelining such subsequence generators.

Furthermore, as shall be appreciated from the following description, relatively easy to implement addition, subtraction, and selection operations may be the totality of operations for implementing subsequence generators. Thus, it should be appreciated that high performance and low latency may be achieved with relatively simple circuit operations.

Again, for a skip value of n equal to two there would be two subsequences. For a skip value n equal to 2, the odd sequence may begin at one and skip even values for a sequence 1, 3, 5, . . . . This may be called the odd subsequence. What may be called the even subsequence for a skip value n equal to 2 may start at zero and skip odd values, namely 0, 2, 4, . . . . Of note, the skip value n may be set equal to any integer value greater than zero. If however, the skip value is set for n equal to one, advantages associated with having sequences generated in parallel may not be obtained. For values of n greater than two, additional parallel processing may be provided though at the expense of additional complexity. However, generally the larger the skip value n, the more pipelining that may be implemented in order to increase the operating frequency of a circuit.

For purposes of clarity by way of example and not limitation, it shall be assumed that the skip value is set to equal 2, as from a description of such a skip value use of other skip values shall be understood. Moreover, along those lines, it shall be appreciated that modularity for implementing address sequence generation as described herein facilitates scaling responsive to the skip value. With respect to use of an FPGA, the availability of multiple resources which may be configured in parallel, such as in a pipeline, and which may be modularly replicated, facilitates in the field scaling of address sequence generation responsive to user parametric input, including input of values for block size K, skip value n, and coefficients $f_1$, and $f_2$.

At 202, odd and even address parameters are initialized responsive to the skip value. For a skip value of n equal to two, initial odd and even address parametric values, namely $A_{even}$ and $A_{odd}$, may be generated as indicated respectively in Equations 1a and 1b.

At 203, odd and even increment parameters are initialized responsive to the skip value of n. Again, continuing the example of a skip value of n equal to two, an even increment, $I_{even}$, value and an odd increment value, $I_{odd}$, are initialized to values as respectively indicated in Equations 2a and 2b.

At 204, a step parameter is initialized responsive to the skip value. Again, for a skip value of n equal to two, the step parameter S is a constant as indicated in Equation 3a. Of note, it is assumed for purposes of clarity that values for coefficients $f_1$, and $f_2$ are constants.

At 205, an iteration or count index value is initialized. For example, such count index i may be set equal to zero. Count index i may be indexed as in looping operation. Thus, count index i may begin at zero and proceed to K−1, namely the sequence for generating a sequence of addresses, with unit steps of one. Operations 201 through 205 may be generally referred to as initialize parameters 210. After parameters 210 are initialized, the loop may begin at 206.

At 206, an output address is selected from an odd or an even stream of address sequence values. In the above example for n equal to two, the even stream is 0, 2, 4, . . . , and the odd stream is 1, 3, 5, . . . . This selection of an output address from an odd or even stream may be implemented as an if, then, else operation. If the iteration index i modulo n, for n equal to two, is equal to zero, then the output address for the iteration index (Address [i]) may be set equal to or selected as being equal to a then current even address value, $A_{even}$. If, however, the iteration index i modulo 2 is not equal to zero, then the output address (Address [i]) may be set equal to or selected as being equal to a then current odd address value, $A_{odd}$. For an initial iteration, it should be appreciated that the initial output address shall be one of the address parameters set at operation 202.

At 207, the address is updated from a variable increment. For an initial iteration, the address initialized at 202 is updated with the increment parameter initialized at 203.

At 208, an increment update from a constant step is preformed. It should be appreciated that the step value initialized at 204 is a constant value once the skip value is set. Accordingly, at 208 the increment parameter initialized at 203 may be updated using the step value initialized at 204 on an initial iteration.

It should be appreciated that on subsequent iterations, results from the update operations at 207 and 208 are subsequently used to updated address and increment parameter values.

Figure 3:
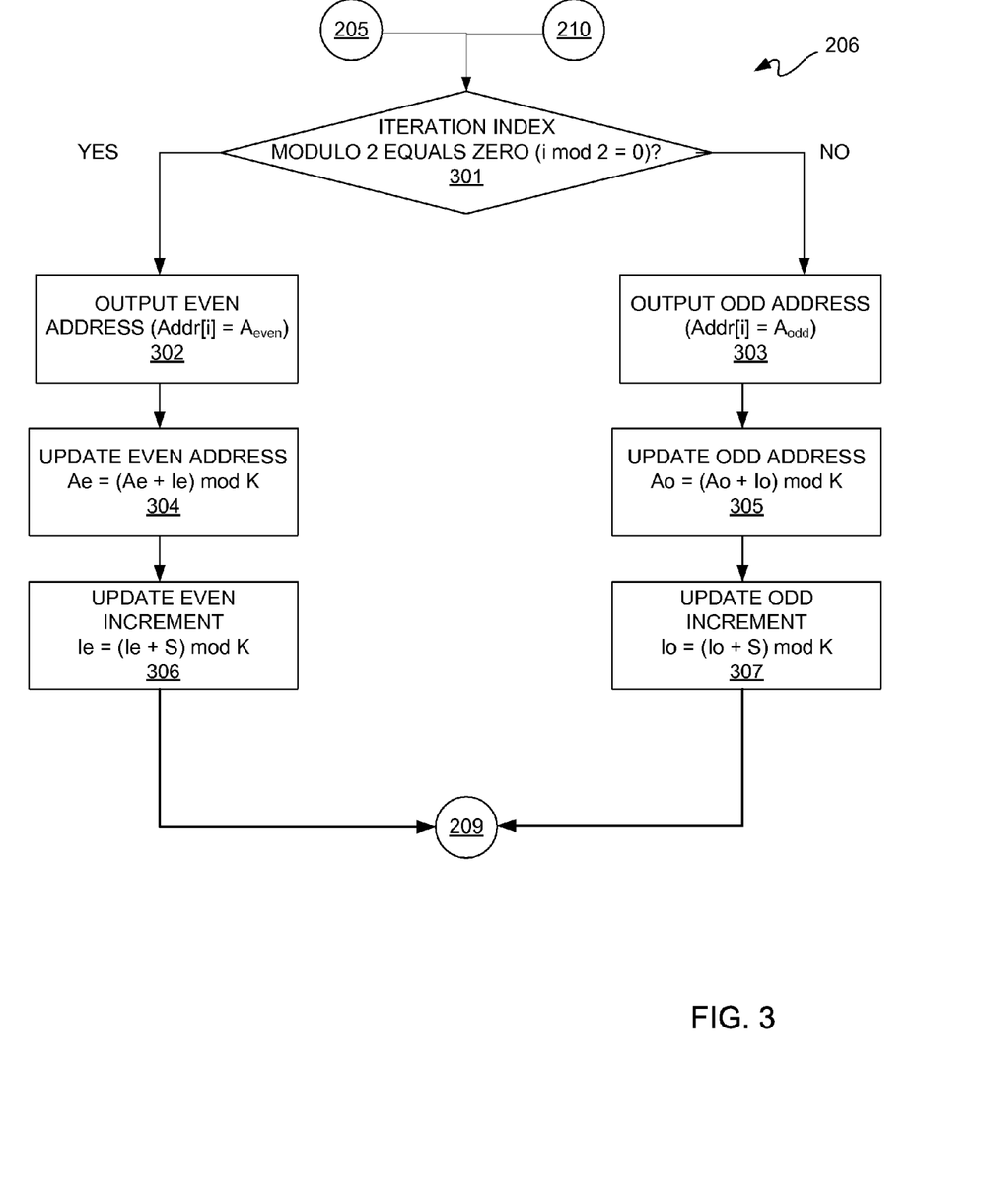
FIG. 3 is a flow diagram depicting an address output selection operation in accordance with an embodiment of the present invention.

FIG. 3 is a flow diagram depicting an exemplary embodiment of an address output selection operation 206, an address update operation 207 and an increment update operation 208. At 301, an iteration index modulo 2 calculation is performed. Of note, modulo 2 follows the example used to describe operations; however, values other than modulo 2 may be used. At 301, it is determined whether or not the result of this calculation is equal to zero. If the result of this calculation is equal to zero, then the actions described below for steps 302, 304 and 306 are carried out. If, however, at 301 the result of the iteration index i modulo 2 does not equal zero, then the actions described below for steps 303, 305 and 307 are carried out.

At 302 the output address, namely the address for a then current iteration index i, is set or selected as being equal to the even address as previously described. At 304, the even address is updated. The summation of the even address and the even increment modulo K provides a new even address as a then current even address which may be used on a subsequent iteration. Likewise, at 306 the summation of the even increment and the step value modulo K provides a new even increment as a then current even increment which may be used on a subsequent iteration.

Similarly, at 303 the output address, namely the address for a then current iteration index i, is set or selected as being equal to the odd address as previously described. At 305, the odd address is updated. The summation of the odd address and the odd increment modulo K provides a new odd address as a then current odd address which may be used on a subsequent iteration. Likewise, at 307 the summation of the odd increment and the step value modulo K provides a new odd increment as a then current odd increment which may be used on a subsequent iteration.

It is noted here that the abbreviation "Ae" is intended to mean "$A_{even}$," and the abbreviation "Ie" is intended to mean "$I_{even}$". Similarly, the abbreviation "Ao" is intended to mean "$A_{odd}$" and the abbreviation "Io" is intended to mean "$I_{odd}$". These abbreviations are used with the same intended meanings throughout this description.

Returning to FIG. 2, at 209 the iteration index i may be incremented by one for performing another iteration of the loop. At 210, it may be determined whether the iteration index i exceeds the block size K. Of note, for this example, it is determined whether i exceeds K−1, as i starts at zero. If K iterations have been performed, then address generation flow 200 ends at 299. If, however, K iterations have not yet been performed, then another iteration is performed starting at 206.

It should be understood that coefficients $f_1$ and $f_2$ are generally constants for each of the operations. Furthermore, it should be understood that step S is a constant for a selected skip value n. However, it should be understood that the address values may change from iteration to iteration in a permutated order responsive to varying of increment values. Furthermore, it should be appreciated that the increment values are incremented the step size for each iteration.

Figure 4A:
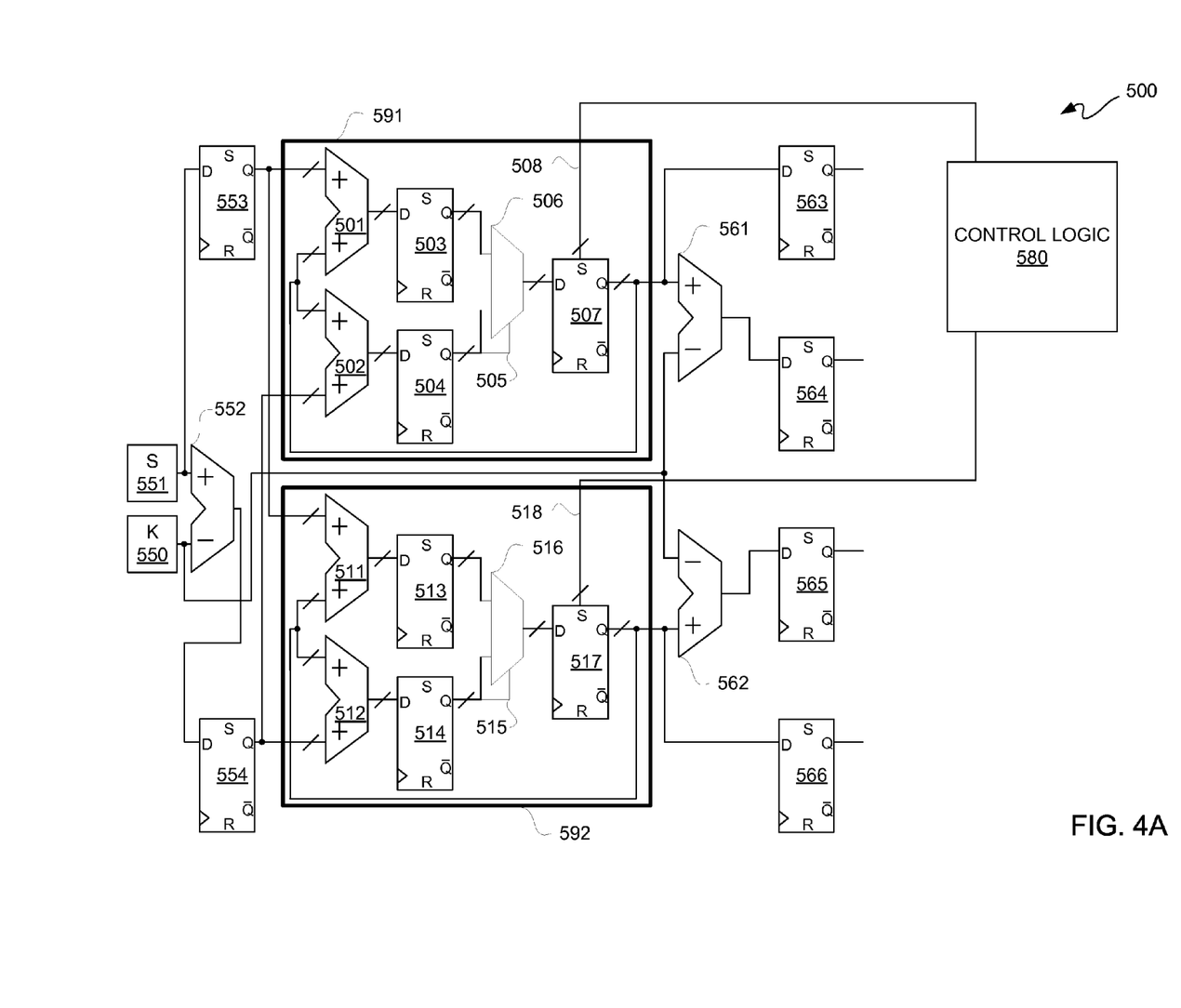
FIGS. 4A and 4B in combination are a block/schematic diagram depicting an address generator in accordance with an embodiment of the present invention.
Figure 4B:
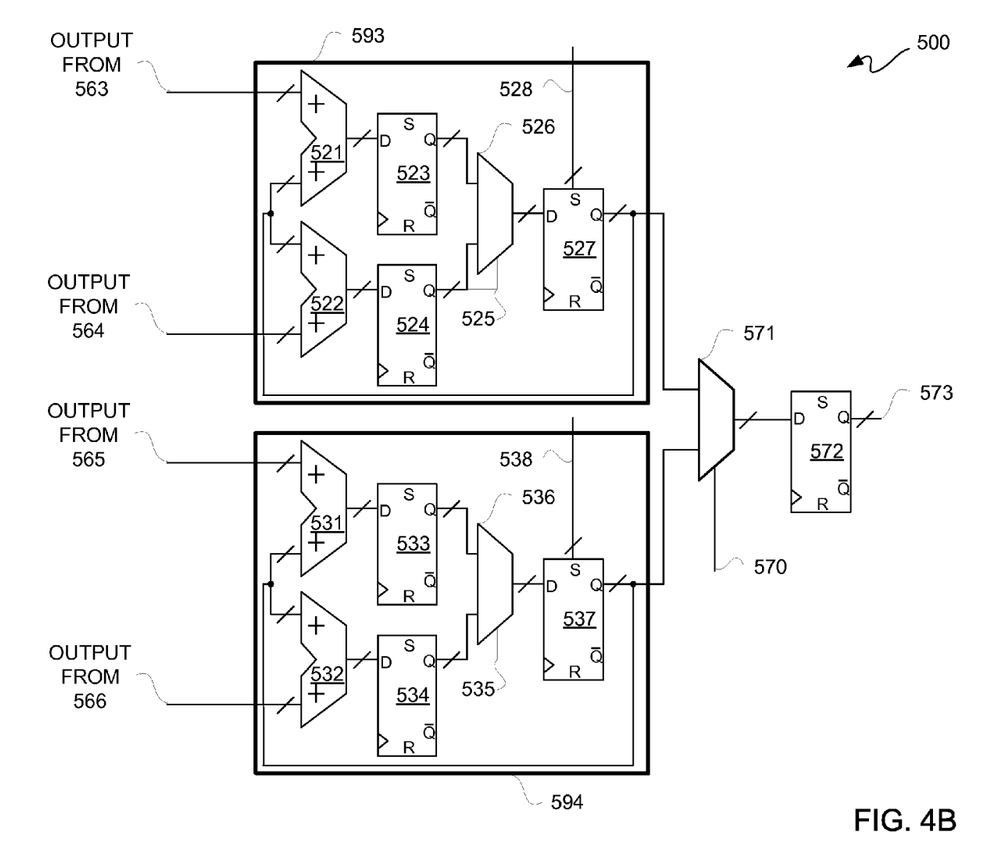

FIGS. 4A and 4B in combination are a block/schematic diagram depicting an exemplary embodiment of an address generator 500. Clock signals and other circuitry which follow from the description herein are not illustratively shown in FIGS. 4A and 4B for purposes of clarity and not limitation. Additionally, control signaling to supply enable pulses to load flip-flops with initialization values is not shown for purposes of clarity and not limitation.

Address generator 500 includes subsequence generator blocks 591 through 594, control logic 580, subtractor 561, subtractor 562, subtractor 552, step storage 551, block size storage 550, multiplexer 571, flip-flops 553 through 554, flip-flops 563 through 566, and flip-flop 572.

Subsequence generator blocks 591 and 592 are for updating odd and even increments, and subsequence generator blocks 593 and 594 are for updating odd and even addresses. Increment subsequence generator blocks 591 and 592 respectively are in front of address subsequence generator blocks 593 and 594. Furthermore, subsequence generator blocks 591 and 593 in combination are for one half of an address sequence, for example an even half as previously described for a skip value of n equal to 2, and subsequence generator blocks 592 and 594 in combination are for another half of an address sequence, for example an odd half as previously described for a skip value of n equal to 2.

It should be appreciated that subsequence generator block as described herein are quite modular. This facilitates scaling as previously mentioned. Additionally, it should be understood even though a skip value of n equal to 2 is being used for purposes of clarity by way of example, a large skip value may involve more sets of subsequence generator blocks. It should further be understood that sets of subsequence generator blocks may be in parallel for pipelining.

Address generator 500 may be part of an interleaver circuit, such as a QPP interleaver. The four subsequence generator blocks are four modulo add blocks used to compute linear sequence modulo block size K plus the additional circuitry mentioned. Subsequence generator blocks 591 and 592 are for the increment update operation previously described, and subsequence generator blocks 593 and 594 are for the address update operation previously described. The size of variables, namely the bit width of registers, may be set responsive to a largest block size K to be accommodated.

It should be appreciated that implementing modulo based circuitry facilitates a reduction in circuitry. For example, a number X in a range of zero to two N−1 may be reduced modulo N into a range of zero to N−1 by subtracting N from X if X is greater than N.

Modulo N accumulation may be reduced to addition followed by comparison followed by subtraction followed by selection of an appropriate value. To reduce latency of this operation, two clock cycles may be used with a pre-subtraction implemented operation. The pre-subtraction operation may use modulus N subtraction from one of the addends in advance, and addition of a positive-biased and a negative-biased value may proceed in parallel. This allows for the comparison operation in modulo N accumulation to be obviated, because if the result of the negative-biased subtraction is less than zero it cannot be in the range of zero to N−1, and thus the "sign bit," namely the Most Significant Bit ("MSB"), of a negative-biased value may be used directly to select which result to propagate forward. Effectively, this is what is implemented in address generator 500, where rather than N, a block size K is used.

Step size S is obtained from step storage 551 and provided to a positive port of subtractor 552. Block size K is provided from block size storage 550 to a negative port of subtractor 552 for subtraction from the step size S obtained from step storage 551 and also provided to subtractor 552. The difference output from subtractor 552 is provided as a data input to flip-flop 554.

Step size S from step size storage 551 is further provided as a data input to flip-flop 553. Block size from block size storage 550 is further provided to minus ports of subtractors 561 and 562, respectively.

Output of flip-flop 554 is provided to adder 512 of subsequence generator block 592 and to adder 502 of subsequence generator block 591. Output of flip-flop 553 is provided to adder 501 of subsequence generator block 591 and to adder 511 of subsequence generator block 592.

The output of subsequence generator block 591, namely even increment $I_{even}$, is fed back and provided as an input to adders 501 and 502. Likewise, the output of subsequence generator block 592, namely increment odd $I_{odd}$, is fed back and provided as an input to adders 511 and 512.

Outputs of adders 501 and 502 are respectively provided as data inputs to flip-flops 503 and 504 of subsequence generator block 591, and outputs of adders 511 and 512 are respectively provided as data inputs to flip-flops 513 and 514 of subsequence generator block 592. Flip-flop 503 may store an increment even positive-biased value for values of an even sequence, and flip-flop 504 may store increment even negative-biased values for values of the even sequence.

The difference between results stored in flip-flops 503 and 504 is the block size K, namely minus K, obtained from storage 550. Outputs of flip-flops 503 and 504 are respectively provided as inputs to multiplexer 506. An MSB bit of output from flip-flop 504 is provided as a control select signal to multiplexer 506 to select between outputs from flip-flops 503 and 504 for providing as an increment even output therefrom to flip-flop 507.

If the value stored in flip-flop 504 is negative, then the value in flip-flop 503 is selected. For example, if the value stored in flip-flop 504 is a negative value, then MSB 505 is a logic 1. A logic 1 may select the output of flip-flop 503 for output from multiplexer 506.

If, however, the value stored in flip-flop 504 is positive, then MSB 505 is a logic 0. A logic 0 for MSB 505 may cause the output of flip-flop 504 to be selected by multiplexer 506 for output.

In other words, if the value in flip-flop 504 is positive, then the value being processed in flip-flop 504 is within the range of zero to K−1. If, however, the value in flip-flop 504 is negative, then the value in flip-flop 503 is in the range of zero to K−1.

The output from multiplexer 506 is provided as an output to flip-flop 507 for providing an increment even output therefrom and from subsequence block 591. Flip-flop 507 may be initialized to an initial even increment value, as described for example with reference to operation 203 of FIG. 2, and as generally indicated as set signal 508. Set signal 508 may be provided from control logic 580. Control logic 580 may include a counter, though not illustratively shown for purposes of clarity and not limitation, for counting values of an iteration index i responsive to clock cycles.

Likewise, subsequence generator block 592 may be configured with flip-flops 513 and 514, multiplexer 516, and flip-flop 517, respectively corresponding to the description of subsequence generator block 591 but for generation of an odd increment. Thus, flip-flops 513 and 514 may respectively store an increment odd for a positive biased value and a negative biased value using, where an MSB 515 of output from flip-flop 514 is used as a control signal to multiplexer 516.

An odd increment output from flip-flop 517 of subsequence generator block 592 is provided to an add port of subtractor 562 and to flip-flop 566. An even increment output from flip-flop 507 of subsequence generator block 591 is provided to an add port of subtractor 561 and to flip-flop 563. Block size K from block size storage 550 is subtracted from the even increment and the odd increment respectively by subtractors 561 and 562. Outputs from subtractors 561 and 562 are respectively provided to as data inputs to flip-flops 564 and 565.

Of note, control logic 580 may be used to supply initialization values, as described with respect to operation 203, for initializing flip-flops 507 and 517 as generally indicated by set signals 508 and 518. Furthermore, control logic 580 may be configured to count iterations, such as from zero to K−1, as previously described with reference to FIG. 2, for sequence generation.

Flip-flops 563 through 566 form a register stage of address generator 500 prior to subsequence generator blocks 593 and 594. Subsequence generator blocks 593 and 594 may have the same circuitry as subsequence generator block 592 and 591. However, the inputs to adders 521 and 522 of subsequence generator block 593 and to adders 531 and 532 of subsequence generator block 594 are different than previously described.

Output of flip-flop 563 is provided as an input to adder 521 and output of adder 564 is provided as an input to adder 522. Output of flip-flop 565 is provided as an input to adder 531, and output of flip-flop 566 is provided as an input to adder 532.

Subsequence generator block 593 may be for generating even addresses, and subsequence generator block 594 may be for generating odd addresses. Thus, output of adder 521 provided to flip-flop 523 of subsequence generator block 593 may store an even address of a positive biased value. Output of adder 522 provided to flip-flop 524 of subsequence generator block 593 may store an even address of a negative biased value. Outputs from flip-flops 523 and 524 may be provided to multiplexer 526, the output of which is provided to flip-flop 527. An MSB 525 output from flip-flop 524 may be provided as a control signal to multiplexer 526.

Output of adders 531 and 532 are respectively provided as inputs to flip-flops 533 and 534, and the outputs of flip-flops 533 and 534 are provided as inputs to multiplexer 536. An MSB 535 of the output of flip-flop 534 is provided as a control select signal to multiplexer 536, and the output of multiplexer 536 is provided as an input to flip-flop 537.

Flip-flop 527 may be set responsive to set signal 528, and flip-flop 537 may be set responsive to set signal 538. Initial address values may be used to set flip-flops 527 and 537, such initial address values were previously described with reference to operation 202 of FIG. 2. Thus, flip-flop 527 may be set with an initial address value for an even address, and flip-flop 537 may be set with an initial value for an odd address.

Set signals 528 and 538 may be provided from control logic 580, though not illustratively shown in figure for purposes of clarity and not limitation. Output of flip-flop 527 is provided as a feedback input to adders 521 and 522, and output of flip-flop 537 is provided as a feedback input to adders 531 and 532. Outputs of flip-flops 527 and 537 are respectively an even address and an odd address, and are further provided as inputs to multiplexer 571.

A control select signal 570 which may alternate between odd and even selection responsive to clock cycle may be provided by control logic 580, though not illustratively shown for purposes of clarity and not limitation. Thus, an even address or an odd address may be selected responsive to control select signal 570 for output from multiplexer 571. Output from multiplexer 571 may be provided as an input to flip-flop 572.

Output of flip-flop 572 is an address sequence 573. It should be appreciated that one half of address sequence 573 may be from subsequence generator blocks 591 and 593 and that another half of address sequence 573 may be from subsequence generator blocks 592 and 594. By having separate halves, namely subsequence generator blocks 591 and 593 as one half and subsequence generator blocks 592 and 594 as another half, address generator 500 may output a new address for address sequence 573 on each clock cycle after any latency has been taken up. In other words, generally by duplicating circuitry for providing odd and even subsequences and then combining such subsequences at an output stage, a new result may generally be output on each clock cycle.

Initialization values for flip-flops 507, 517, 527, and 537 are not the same for the two branches as previously described with reference to Equations 1 through 3. However, initialization vectors provided to flip-flops 507, 517, 527, and 537, respectively, may be stored in a look-up table (not shown for purposes of clarity) in control logic 580, as such values may be pre-computed in accordance with Equations 1 and 2 for various skip values and block sizes. Alternatively, initialization values may be computed dynamically. Furthermore, block size may be a user supplied input stored in block size storage 550, which may be a registered value. Step value S step value in step value storage 551 may be dynamically determined responsive to parametric user input, or pre-computed values may be stored in a look-up table.

Because only half of the outputs are used at a time in address generator 500, it is possible to combine subsequence generator blocks 591 and 592, as well as to combine subsequence generator blocks 593 and 594.

Figure 5:
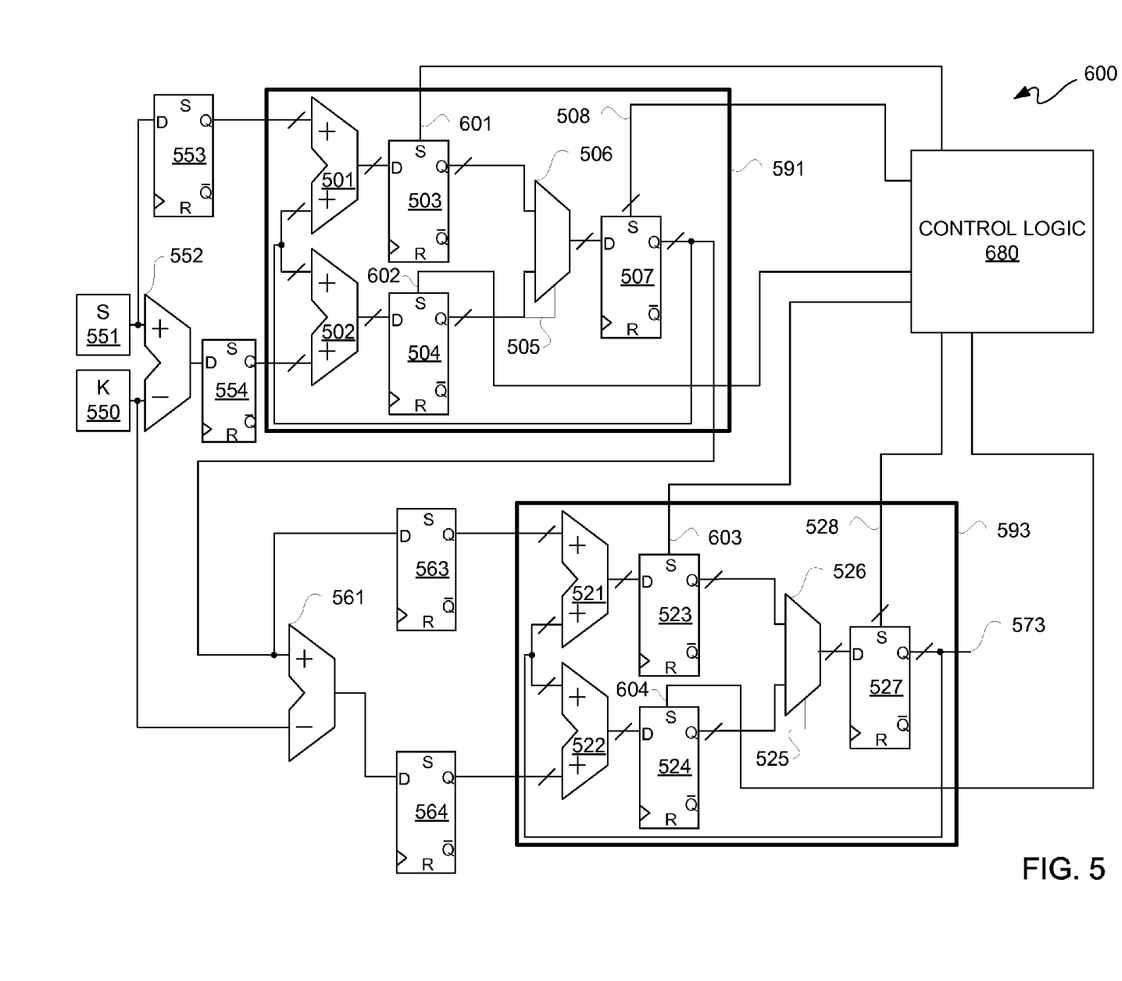
FIG. 5 is a circuit diagram depicting an address generator in accordance with an embodiment of the present invention.

FIG. 5 is a circuit diagram depicting an exemplary embodiment of an address generator 600. Address generator 600 includes subsequence generator blocks 591 and 593, control logic 680, flip-flops 553, 563, and 564, and step value storage 551, block size storage 550, and subtractors 552 and 561. As much of the operation of address generator 600 is the same as address generator 500 of FIGS. 4A and 4B, such description is not repeated for purposes of clarity. However, it should be understood that initialization values are provided to each of registers 507 and 527, as well as to one of registers 503 and 504, and to one of registers 523 and 524.

Set signals 601 through 604 are respectively provided to flip-flops 503, 504, 523, and 524. Such set signals 601 through 604, as well as set signals 508 and 528, may be provided by control logic 680. Control logic 680 is similar to control logic 580 of FIGS. 4A and 4B, except the additional initialization values for intermediate registers are provided such as via set signals 601 through 604.

It should be appreciated that the above description may be extended to any permutation polynomial interleaver of a higher order, such as for adoption in a communication system. Because subsequence generator blocks are replicated, scaling to accommodate a larger skip value is facilitated. Furthermore, de-interleaving may be implemented by providing the same sequence as address sequence 573, though in reverse order. Furthermore, the address sequence output as address sequence 573 need not be provided with a unit stride, but may have a non-unit stride. Thus, it is not necessary to step through with an iteration index from zero to K−1 with an increment of one, as an increment value greater than one may be used if desired.

However, in order to allow for a reverse in the order for a non-unit stride, the vectors supplied as initial or set conditions for subsequence generator blocks may be adjusted. This may be useful in a decoding process, where an algorithm for decoding may move backward and forward through received data using a fixed size window or windows for sampling.

As indicated above, a step value, n, other than 2 may be used. Along those lines, the following pseudo-code listing is provided to more generally indicate use of any positive integer step value of interest:

```
// Let K be the block size, and N be the skip value.
// Initialization.
// Addresses (A) get their initial values from the QPP function.
// Increments (I) get their initial values from its first derivative.
// The step (S) gets its value from the second derivative.
    for j := 0 to N−1 loop
        A[j] = (j*f1 + j*j*f2) mod K
        I[j] = (f2*(2*N*j + N*N) + f1*N) mod K
    end loop
    S = (2*N*N*f2) mod K
// Computation:
    for i := 0 to K−1 loop
        // Choose output address from appropriate phase
        Addr[i] = A[i mod N]
            // Update address from varying increment
            A[i mod N] := (A[i mod N] + I[i mod N]) mod K
            // Update increment from constant step
            I[i mod N] := (I[i mod N] + S) mod K
    end loop
```

Figure 6:
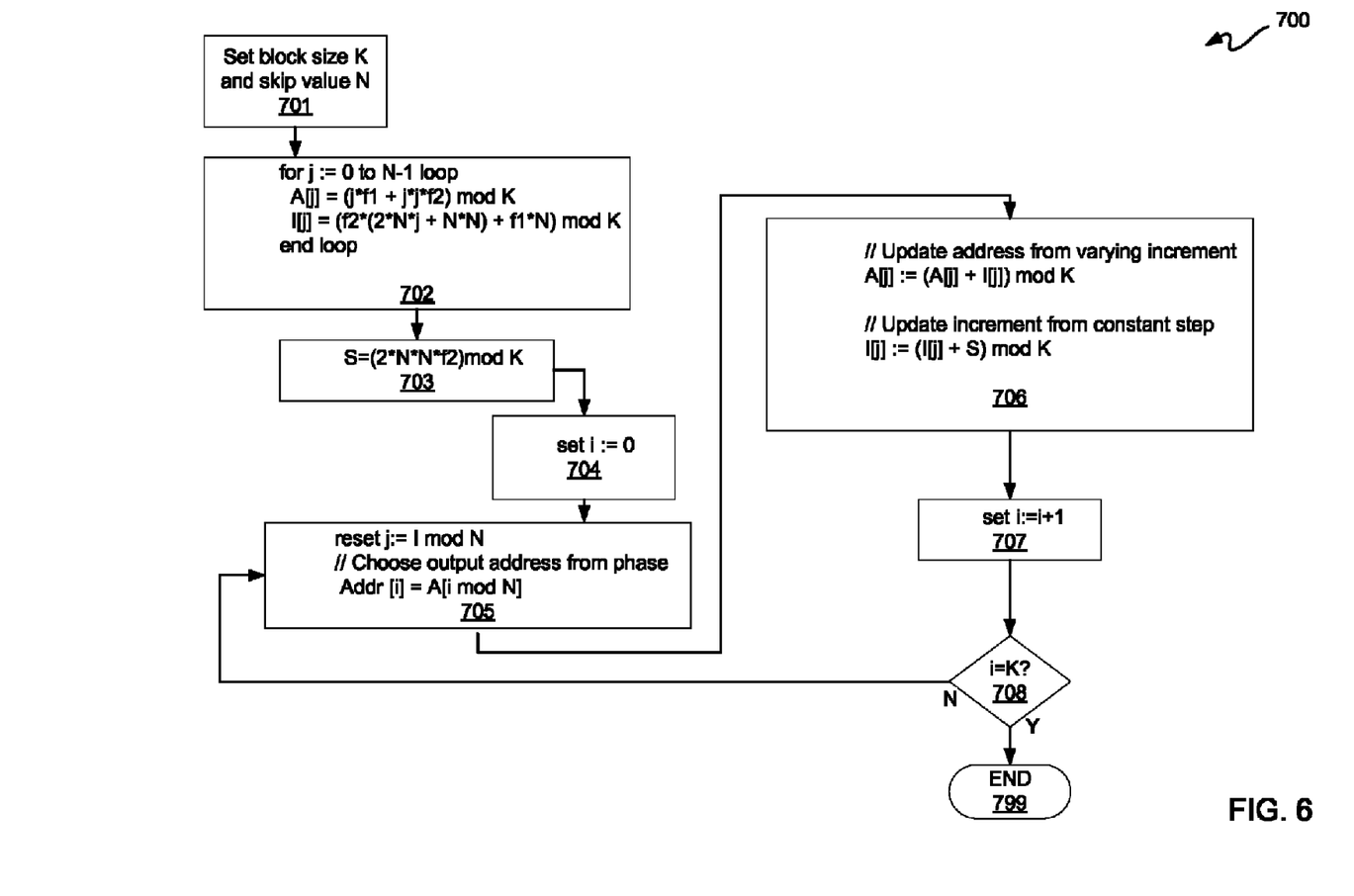
FIG. 6 is a flow diagram depicting an address generation flow in accordance with an embodiment of the present invention.

Moreover, FIG. 6 is a flow diagram depicting an embodiment of an address generation flow 700 corresponding to pseudo-code listing 700. At 701, block size K and skip value N are obtained or otherwise set. At 702, addresses A[j] and increments I[j] are iteratively initialized for j from 0 to (N−1), namely incrementally by increments of one from 0 to the skip value minus one, where A[j]=[(j*f1+j*j*f2) mod K] and I[j]=[(f2*(2*N*j+N*N)+f1*N) mod K]. Thus, there are N addresses and increments in respective arrays or sets of initial addresses and corresponding initial increments. At 703, step size S is set to a value, where step size S=[(2*N*N*f2) mod K]. Of note, the initialization loop at 702 is independent of setting step size S at 703.

After initialization of initial addresses, initial increments, and step size, computation of address sequences may be performed. At 704, count index i is set to zero.

At 705, variable j is set to equal the phase index which is the count index i modulo N, As indicated in FIG. 6, output address Addr[i] is set equal to A[j], which is to say A[i mod N].

At 706, an address is updated for phase index j, where the updated address A[j]=[(A[j]+I[j]) mod K]. Furthermore, at 706, an increment is updated for phase index j, where the updated increment is I[j]=[(I[j]+S) mod K] for a constant step S.

At 710, it is determined whether count index i equals block size K set at 701. If count index i equals block size K at 710, then address generation flow 700 ends at 799. If, however, count index i does not equal block size K at 710, then address generation flow 700 continues by outputting another output address Addr[i] at 705 but for an incremented count index i. Thus, this output address Addr[i] is associated with a phase for an incremented count index i.

If skip value N is set equal to one in the above pseudo-code listing, then such pseudo-code listing generally reduces to the following pseudo-code listing for generation of a sequence:

```
// Initialization.
    A = 0
    I = (f2 + f1) mod K
    S = (2*f2) mod K
// Computation:
    for i := 0 to K−1 loop
        // Choose output address from appropriate phase
        Addr[i] = A
        // Update address from varying increment
        A := (A + I) mod K
        // Update increment from constant step
        I := (I + S) mod K
    end loop
```

Thus, there is only one phase present if skip value N equals one. However, if skip value N is set equal to two or larger positive integer in the above pseudo-code listing, then such pseudo-code listing generally conforms to the prior description. Accordingly, it should be understood that various skip values, block sizes, and other parameters may be used in accordance with the description herein.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for address generation, comprising:
   obtaining a block size and a skip value;
   initializing at least one address, at least one increment value, and a step value; wherein the initializing of the at least one address follows from: $\Pi(x)=(f_1 x+f_2 x^2) \bmod K$, where K is the block size, where $f_1$, and $f_2$ are respective coefficients associated with a quadratic formula, and wherein the initializing of the at least one increment follows from:

$\Pi'(x)=[f_2(2nx+n^2)+f_1 n)] \bmod K$, where the increment value $\Pi'(x)$ is a derivation of the address $\Pi(x)$, and where n is the skip value and x is a first count index for incrementally counting from a first initial value to a first terminal value;
   setting, by a processor, a second count index for incrementally counting from a second initial value to a second terminal value, the second terminal value being bounded by the block size;
   for the second count index not in excess of the second terminal value, iteratively performing:
      selecting an output address for output from at least one phase responsive to at least the at least one address;
      first updating the at least one address as being equal to summation of the at least one increment value and the at least one address modulo the block size;
      second updating the at least one increment as being equal to summation of the at least one increment value and the step value modulo the block size;
      incrementing the second count index; and
      repeating the selecting, the first updating, the second updating, and
   the incrementing to output a sequence of addresses; and
   outputting the sequence of addresses responsive to iterative generation of the output address.

2. The method according to claim 1, wherein the output address is for Quadratic Permutation Polynomial interleaving.

3. The method according to claim 1, wherein the output address is for interleaving for Turbo code encoding.

4. The method according to claim 1, wherein the output address is for de-interleaving for Turbo code decoding.

5. The method according to claim 1, wherein the initializing of the step value follows from:

$$\Pi''(x)=[2n^2 f_2] \bmod K$$

wherein the step value $\Pi''(x)$ is a derivation of the increment value $\Pi''(x)$.

6. The method according to claim 1, further comprising generating a core for instantiation of the method in programmable logic of a programmable logic device.

7. The method according to claim 6, wherein the skip value is a user input parameter for instantiation of the method.

8. A method for address generation, comprising:
obtaining a block size and a skip value;
initializing a plurality of addresses, a plurality of increment values, and a step value, the initializing of the addresses and the increment values being performed as a first loop having a first count index x bounded by the skip value obtained; wherein the initializing of the plurality of addresses follows from:

$$\Pi(x)=(f_1 x+f_2 x^2) \bmod K,$$

where K is the block size, where $f_1$ and $f_2$ are respective coefficients associated with a quadratic formula, and wherein the initializing of the plurality of increment values follows from:

$$\Pi'(x)=[f_2(2nx+n^2)+f_1 n] \bmod K,$$

where the increment value $\Pi'(x)$ is a derivation of the address $\Pi(x)$, and where n is the skip value and x is the first count index for incrementally counting from a first initial value to a first terminal value;
setting, by a processor, a second count index for incrementally counting from a second initial value to a second terminal value for a second loop, the second terminal value being bounded by the block size;
for the second count index not in excess of the second terminal value, iteratively:
selecting an output address for output from a phase of a plurality of phases; and
incrementing the second count index;
updating the selected address of the plurality of addresses as being equal to summation of the selected address and its associated increment modulo the block size; and
updating the increment associated with the selected address as being equal to summation of the increment and the step value modulo the block size; and
outputting a sequence of addresses responsive to iterative generation of the output address.

9. The method according to claim 8, wherein the initializing in the first loop is
performed for x=0 to n−1.

10. The method according to claim 9, wherein the second loop is capable of being expressed as:

```
for i := 0 to K−1 loop
    Addr[i] = A[i mod N]
    A[i mod N] := (A[i mod N] + I[i mod N]) mod K
    I[i mod N] := (I[i mod N] + S) mod K
end loop
``` where i is the second count index and Addr[i] is the output address.

11. The method according to claim 8, wherein the sequence of addresses is for Quadratic Permutation Polynomial interleaving.

12. The method according to claim 8, wherein the sequence of addresses is for interleaving for Turbo code encoding.

13. The method according to claim 8, wherein the sequence of addresses is for de-interleaving for Turbo code decoding.

14. An apparatus for address generation, comprising:
first storage having a step value;
second storage having a block size;
a first subtractor coupled to the first storage and the second storage to respectively receive the step value and the block size as inputs for subtracting the block size from the step value to output a first difference;
an increment stage coupled to receive the step value and the first difference;
the increment stage configured to update a first increment as being equal to summation of the first increment and the step value modulo the block size and output the updated first increment;
the increment stage further configured to update a second increment as being equal to summation of the second increment and the step value modulo the block size and output the updated second increment;
a second subtractor coupled to the second storage and the increment stage to respectively receive the block size and the updated first increment as inputs for subtracting the block size from the updated first increment to output a second difference;
a third subtractor coupled to the second storage and the increment stage to respectively receive the block size and the updated second increment as inputs for subtracting the block size from the updated second increment to output a third difference;
an address stage coupled to receive the updated first and second increments and the second and third differences;
the address stage configured to update a first address as being equal to summation of the updated first increment and the first address modulo the block size to output an updated first address;
the address stage further configured to update a second address as being equal to summation of the updated second increment and the second address modulo the block size to output an updated second address;
control circuitry configured for initializing the first address, the second address, the first increment, the second increment, and the step value;
the control circuitry further configured to provide a count index associated with counting iterations from 1 to the block size as associated with a sequence;
the control circuitry further configured to select one of the updated first or second addresses for output from a value stream of a plurality of value streams;
the selection of the updated first or second addresses responsive to modulo a skip value of the count index for there being at least two value streams of the plurality of value streams; and
the at least two value streams including a first value stream and a second value stream for respectively selecting the first address or the second address therefrom.

15. The apparatus according to claim 14, wherein:
the initializing of the first address and the second address respectively follow from:

$$\Pi(x)=(f_1 x+f_2 x^2) \bmod K$$

where mod K is modulo the block size, where $f_1$ and $f_2$ are respective coefficients associated with a quadratic formula;

the initializing of the first increment and the second increment respectively follow from:

$$\Pi'(x)=[f_2(2nx+n^2)+f_1 n] \bmod K$$

where the increment value $\Pi'(x)$ for the x-th interleaved output is a derivation of the interleaved address $\Pi(x)$, and where n indicates the skip value; and the initializing of the step value follows from:

$$\Pi''(x)=[2n^2 f_2] \bmod K$$

wherein the step value $\Pi''(x)$ is a derivation of the increment value $\Pi'(x)$.

16. The apparatus according to claim 15, wherein:

the apparatus is provided as a soft core for instantiation in programmable logic of a programmable logic device; and the skip value is a user input parameter for the instantiation of the apparatus.

17. The apparatus according to claim 15, wherein the interleaver address is for Quadratic Permutation Polynomial interleaving.

18. The apparatus according to claim 14, wherein the interleaver address is for interleaving for Turbo code encoding.

19. The apparatus according to claim 14, wherein the interleaver address is for de-interleaving for Turbo code decoding.

* * * * *